United States Patent
Gregorich et al.

(10) Patent No.: US 9,064,757 B2
(45) Date of Patent: Jun. 23, 2015

(54) ENHANCED FLIP CHIP STRUCTURE USING COPPER COLUMN INTERCONNECT

(75) Inventors: Thomas Matthew Gregorich, San Diego, CA (US); Tzu-Hung Lin, Hsinchu County (TW); Che-Ya Chou, Kaohsiung (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 241 days.

(21) Appl. No.: 13/612,860

(22) Filed: Sep. 13, 2012

(65) Prior Publication Data

US 2013/0221536 A1    Aug. 29, 2013

Related U.S. Application Data

(60) Provisional application No. 61/604,681, filed on Feb. 29, 2012.

(51) Int. Cl.
  *H01L 23/00* (2006.01)
  *H01L 23/498* (2006.01)

(52) U.S. Cl.
  CPC ............. *H01L 24/13* (2013.01); *H01L 24/16* (2013.01); *H01L 2224/0554* (2013.01); *H01L 23/49811* (2013.01); *H01L 23/49827* (2013.01); *H01L 23/49838* (2013.01); *H01L 2224/16105* (2013.01); *H01L 24/81* (2013.01); *H01L 2224/0401* (2013.01); *H01L 2224/05567* (2013.01); *H01L 2224/05599* (2013.01); *H01L 2224/13013* (2013.01); *H01L 2224/13082* (2013.01); *H01L 2224/131* (2013.01); *H01L 2224/13147* (2013.01); *H01L 2224/16227* (2013.01); *H01L 2224/16235* (2013.01); *H01L 2224/8114* (2013.01); *H01L 2224/81191* (2013.01); *H01L 2224/81385* (2013.01); *H01L 2224/81815* (2013.01); *H01L 2224/13012* (2013.01); *H01L 2924/00013* (2013.01); *H01L 2224/16225* (2013.01)

(58) Field of Classification Search
  CPC .................................................. H01L 23/5226
  USPC .......................................... 257/774, E23.011
  See application file for complete search history.

(56) References Cited

U.S. PATENT DOCUMENTS

| 8,318,537 B2* | 11/2012 | Pendse | 438/108 |
| 2011/0110061 A1* | 5/2011 | Leung | 361/783 |

FOREIGN PATENT DOCUMENTS

| TW | 485501 | 5/2002 |
| TW | I232072 | 5/2005 |

* cited by examiner

*Primary Examiner* — Edward Wojciechowicz
(74) *Attorney, Agent, or Firm* — Winston Hsu; Scott Margo

(57) ABSTRACT

A flip chip package includes a carrier coupled to a die. The carrier includes: at least a via, for coupling the surface of the carrier to electrical traces in the carrier; and at least a capture pad electrically coupled to the via, wherein the capture pad is plated over the via. The die includes: at least a bond pad formed on the surface of the die; and at least a copper column, formed on the bond pad for coupling the die to the capture pad on the carrier, wherein the copper column is disposed on one side of the capture pad about the via opening only.

7 Claims, 4 Drawing Sheets

ENHANCED FLIP CHIP STRUCTURE USING COPPER COLUMN INTERCONNECT

CROSS REFERENCE TO RELATED APPLICATIONS

This application claims the benefit of U.S. Provisional Application No. 61/604,681, filed on Feb. 29, 2012 and incorporated herein by reference.

BACKGROUND

Flip chip technology is a method for coupling a chip (die) to a carrier, substrate or circuit board, wherein the die is electrically connected to the carrier without using bond wires. Solder bumps on the die surface disposed over the bond pads are used as bonding means, and the chip is then 'flipped' so that it is face down on the carrier. The solder bumps enable electrical coupling to traces in the carrier by means of capture pads and vias. An epoxy covering then 'underfills' the structure to absorb the stress. This technique allows for shorter interconnect lengths as well as more area available for routing.

In conventional technologies, the vias (which couple to electrical traces in the carrier) are filled in with conductive material. The resultant structure is usually not completely flat, such that a dimple is formed on the surface of the conductive material at the opening of the via. The top of the carrier is then plated to form capture pads over each via, where each capture pad is designed to have a similar diameter to the solder bumps on the die. The plating follows the contours of the filled-in via, such that the capture pad also has a dimpled surface, allowing the solder bump to sit in the dimple.

Newer technologies replace the solder bumps with copper (Cu) pillars/columns having a small solder bump at one end for contacting the capture pad. Please refer to FIG. 1A, which shows a diagram of a conventional die package 100 using solder bumps 73 to couple to vias 41, and FIG. 1B, which shows a conventional die package 150 using copper (Cu) columns 81 to couple to vias 41. In both diagrams, the same numerals are used to denote the same components.

FIG. 1A shows a die package 100, comprising a die 112, which has a plurality of bond pads 28 on its surface, each bond pad 28 having a solder bump 73 formed thereon. As shown in the diagram, the die 112 is flipped to couple to a carrier 114 by means of the solder bumps 73. The carrier 114 has a plurality of capture pads 34 on its surface, each capture pad 34 being formed over a via 41. The vias 41 couple to electrical traces (not shown) in the carrier 114. The vias 41 are filled with conductive material, represented by the diagonal lines.

FIG. 1B shows a die package 150, comprising the die 112, flipped to couple to the carrier 114. The bond pads 28 have copper columns 81 formed thereon rather than solder bumps, for coupling the die 112 to the carrier 114. As shown in the diagram, the copper columns 81 have a smaller diameter than the solder bumps 73 in FIG. 1A. In addition, each copper column 81 has a solder bump 93 formed at its end, the solder bumps 93 being of a similar diameter to the copper columns 81. The vias 41 are filled in with conductive material, as in FIG. 1A. The capture pads 54 in FIG. 1B are of a smaller diameter than the capture pads 34 in FIG. 1A, corresponding to the smaller diameter of the copper columns 81.

As illustrated in the two diagrams, the capture pads 34, 54 are formed to have a similar diameter to the connecting solder bumps 73 and 93, respectively. When Copper columns 81 are utilized, their smaller diameter as compared to the conventional solder bumps 73 means the capture pads 54 can be formed with a similarly smaller diameter; the use of Copper columns 81 can therefore free up the bonding area. The smaller diameter solder bump 93, however, has the disadvantage of having poor bonding contact with the plated capture pad 54; in particular, due to the presence of the dimple. Increasing the diameter of the Copper columns 81 can improve the bump-dimple contact, but this involves increasing the cap size, which is not desirable, and also negates the increased bonding area advantage.

SUMMARY

It is therefore an objective of the present invention to provide a flip chip package structure that utilizes copper columns for bonding means, wherein there is good bonding contact between the die and the carrier. This is achieved by providing copper columns that contact a corresponding capture pad on one side of a corresponding via only, wherein the capture pads are plated to be asymmetrical about via openings in the carrier.

A flip chip package comprises a carrier coupled to a die. The carrier comprises: at least a via, for coupling the surface of the carrier to electrical traces in the carrier; and at least a capture pad electrically coupled to the via, wherein the capture pad is plated over the via. The die comprises: at least a bond pad formed on the surface of the die; and at least a copper column, formed on the bond pad for coupling the die to the capture pad on the carrier, wherein the copper column is disposed on one side of the capture pad about the via opening only.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel structure for a flip chip package that utilizes copper columns for coupling a die to a carrier, wherein there is good bonding contact between the die and the carrier, as well as greater flexibility of the bonding structure.

In the following, the diagrams and accompanying descriptions will refer to preferred exemplary embodiments; however, one skilled in the art will be able to perform appropriate modifications after reading the following disclosure. It will be appreciated that any modifications to the proposed design which follow the same inventive concepts as those laid out in the disclosure also fall within the scope of the invention.

Figure 1A:
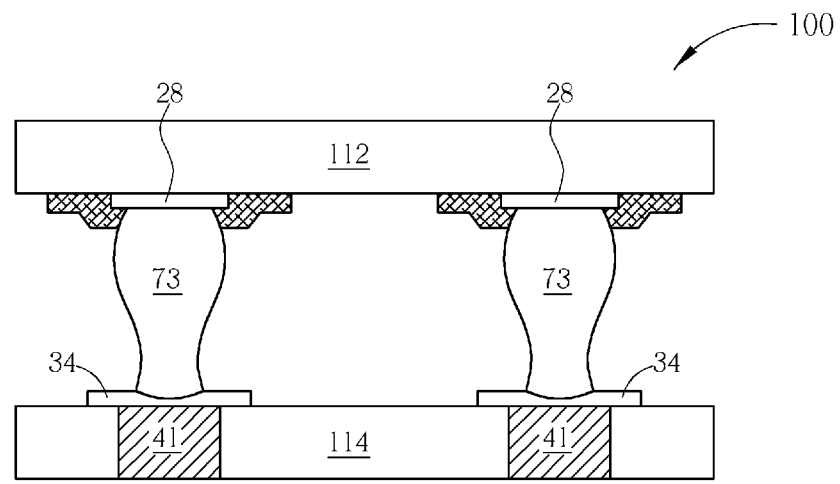
FIG. 1A is a diagram of a conventional flip chip structure where solder bumps disposed on the die couple to capture pads on the carrier.
Figure 1B:
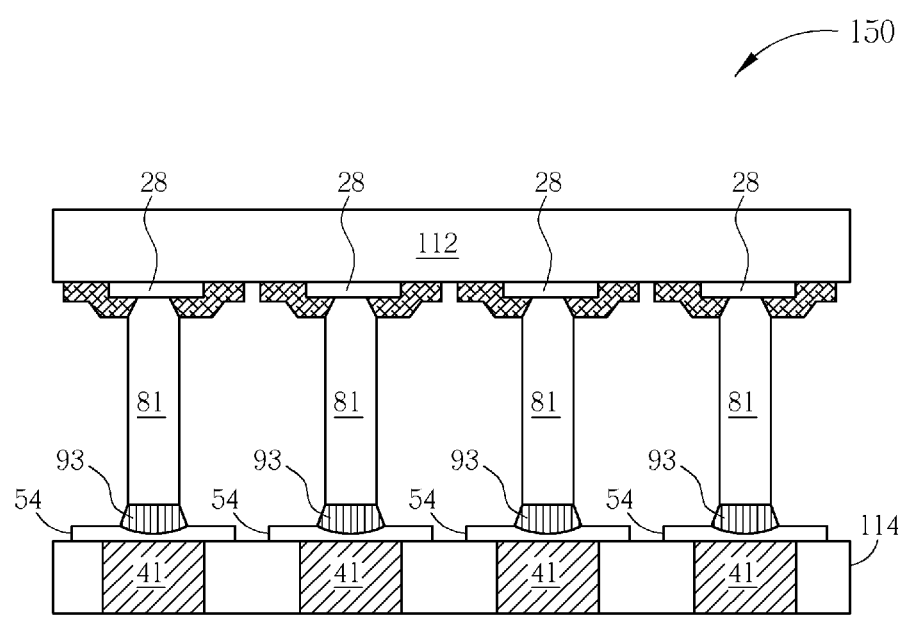
FIG. 1B is a diagram of a conventional flip chip structure using copper columns on the die to couple to capture pads on the carrier.
Figure 2:
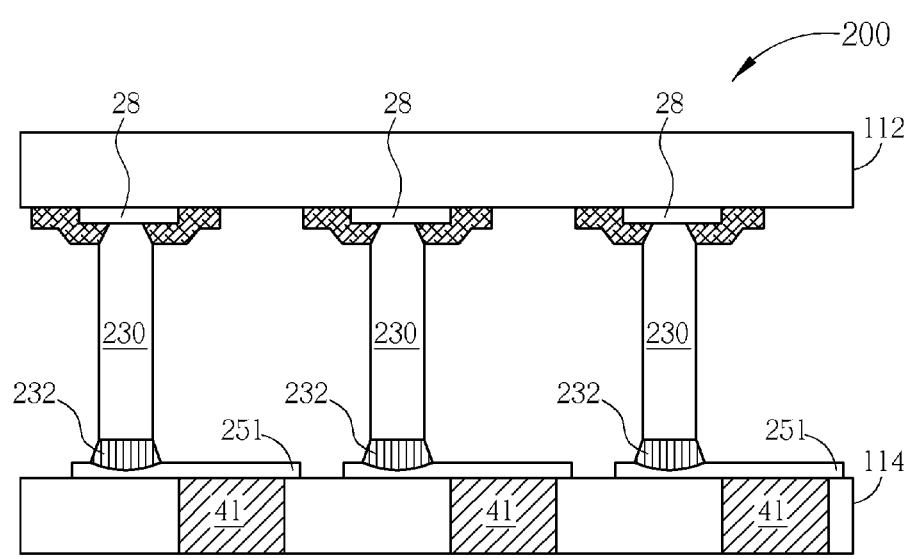
FIG. 2 is a cross-sectional diagram of a flip chip structure according to an exemplary embodiment of the present invention.
Figure 3A:
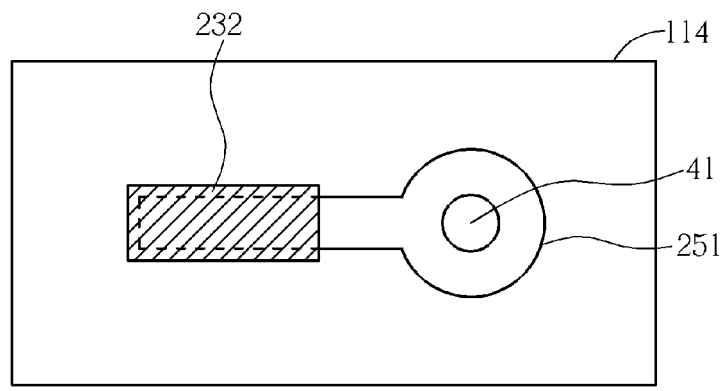
FIG. 3A is a top view of a first embodiment of the flip chip structure shown in FIG. 2.
Figure 3B:
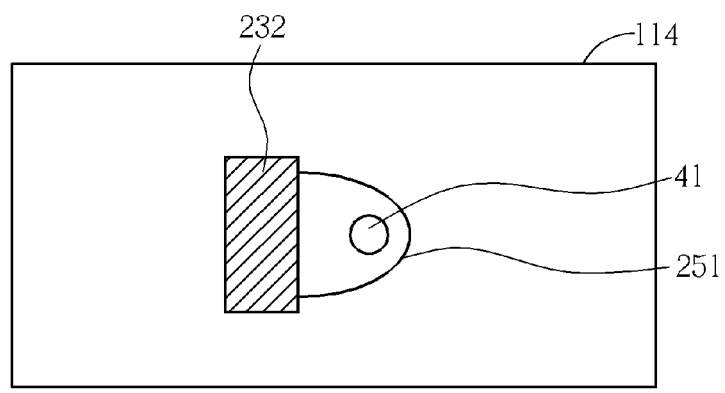
FIG. 3B is a top view of a second embodiment of the flip chip structure shown in FIG. 2.
Figure 3C:
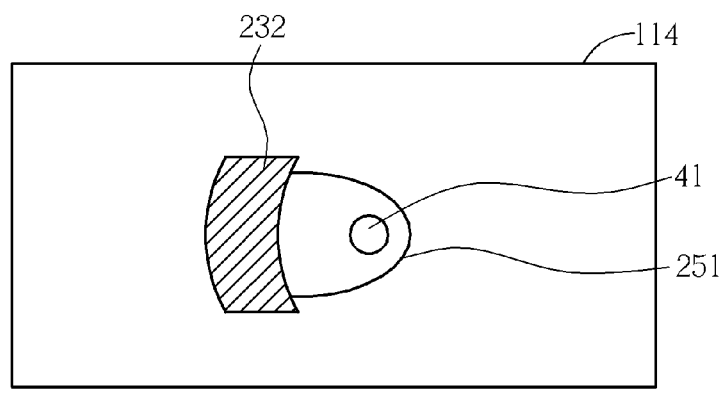
FIG. 3C is a top view of a third embodiment of the flip chip structure shown in FIG. 2.
Figure 4A:
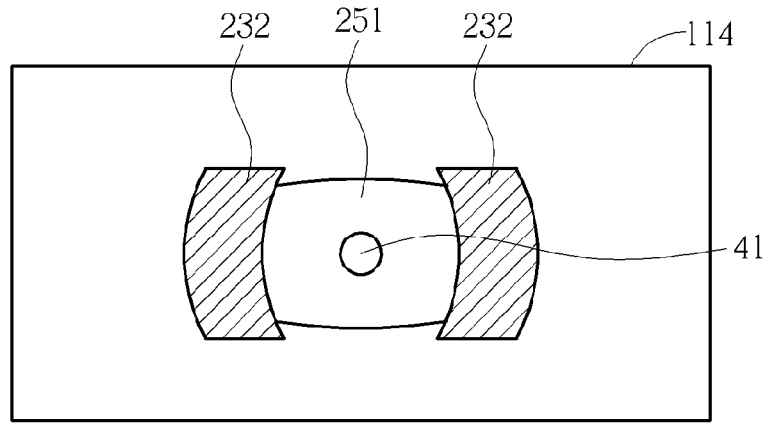
FIG. 4A is a top view of a fourth embodiment of the flip chip structure shown in FIG. 2.
Figure 4B:
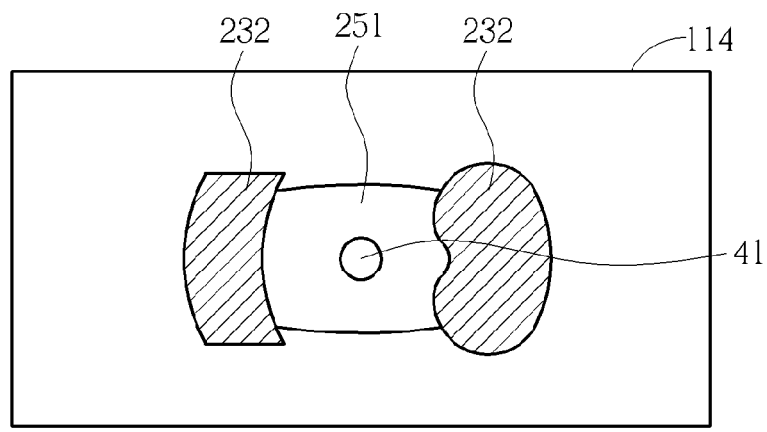
FIG. 4B is a top view of a fifth embodiment of the flip chip structure shown in FIG. 2.

Please refer to FIG. 2, which is a cross-sectional diagram of a proposed flip chip structure 200 according to an exemplary embodiment of the present invention, and FIGS. 3A, 3B and 3C, which are top views of the structure 200 shown in FIG. 2 corresponding to different respective embodiments. Where elements shown in FIGS. 2, 3A, 3B and 3C have the same structure and function as elements shown in FIGS. 1A and 1B, the same numerals have been used.

The proposed flip chip package 200 consists of a die 112 coupled to a carrier 114 in the flip chip manner, and coupled by the means of copper columns 230. Each copper column 230 has a small solder bump 232 on the end for contacting capture pads 251 formed on the surface of the carrier 114. The carrier 114 also has a number of vias 41 for coupling the capture pads 251 to traces (not shown) in the carrier 114.

In the structure 200 shown in FIGS. 2, 3A, 3B and 3C, the vias 41 are left unfilled, as opposed to the conventional art. In other words, the electrical connection between the via 41 and the capture pads 251 occurs through the sidewall of the via 41 rather than through conductive material.

As the vias 41 are empty, it is desirable that the copper column 230 (and the solder bump 232 on the end of the column 230) is placed on the capture pad 251 so no part of the copper column 230 is placed over the via opening 41. This ensures both the best electrical connectivity and the best mechanical stability. This feature results in the copper columns 230 being placed on only one side of their corresponding capture pads 251, as illustrated in FIGS. 3A, 3B and 3C.

In order to ensure the electrical connectivity, five different embodiments are disclosed herein, which are respectively illustrated in FIGS. 3A, 3B, 3C, 4A and 4B. As can be seen by comparing these diagrams with FIG. 2, the cross-sectional appearance of the copper columns 230 and capture pads 251 is the same, but the top views as illustrated in FIGS. 3A, 3B, 3C, 4A and 4B are different from each other. The respective differences will be detailed in the following, with reference to their accompanying diagrams.

Please refer to FIG. 3A, which illustrates a top view of the capture pads 251, via openings 41 and solder bumps 232 as formed on the carrier 114 according to a first embodiment. As shown in this embodiment, the capture pads 251 are symmetrical about the via openings 41 apart from one rectangular section which extends out to one side of the capture pads 251. The copper columns 230 and the solder bumps 232 are disposed entirely on this rectangular section.

Please refer to FIG. 3B, which illustrates a top view of the capture pads 251, via openings 41 and solder bumps 232 as formed on the carrier 114 according to a second embodiment. As shown in this embodiment, the capture pads 251 are asymmetrical about the via openings 41, and the copper columns 230 and solder bumps 232 are disposed on the side of the capture pads 251 having the greater area.

Please refer to FIG. 3C, which illustrates a top view of the capture pads 251, via openings 41 and solder bumps 232 as formed on the carrier 114 according to a third embodiment. As shown in this embodiment, the capture pads 251 are asymmetrical about the via openings 41, and the copper columns 230 and solder bumps 232 are disposed on the side of the capture pads 251 having the greater area, as in the previous embodiment. The difference between the second and third embodiment is that the copper columns 230 and solder bumps 232 are shaped to follow the shape of the capture pads 251. In FIG. 3C, solder bumps 232 (and therefore copper columns 230) having kidney-shaped or C-shaped cross-sectional areas are formed.

As detailed above and illustrated in FIGS. 3A, 3B and 3C, the copper columns 230 will only contact one side of the capture pads 251 about the via openings 41. This structure allows the copper column 230 to take maximum advantage of the capture pad 251 conductivity, without any part of the copper column 230 overlapping the via opening 251. This also ensures the copper column 230 will have good bonding contact.

In the above examples, the particular shape of the capture pad 251 and the copper column 230 means that more than one copper column 230 can be placed on the capture pad 251. This could be done in situations where more power is required, for example. In this case, it would be preferable to elongate the capture pad 251 in both directions, such that it is shaped like an ellipse, so that Copper columns 230 can be placed either side of the via opening 251, as illustrated by the fourth embodiment shown in FIG. 4A. Further, as illustrated by the fifth embodiment shown in FIG. 4B, the Copper columns 230 may be different shapes from each other. The number of Copper columns 230 that can be placed on a single capture pad 251 is only limited by the size and shape of the capture pad 251: for best contact and maximum wetting ability, the Copper columns 230 must remain within the part of the capture pad 251 that is not over the via opening 41. Furthermore, although this modification may result in Copper columns 230 being placed very close together, the space between the Copper columns 230 will be filled with a dielectric material to 'underfill' the structure 200, which acts to insulate the Copper columns 230 from each other.

The shape of the capture pad 251 is also not limited to the egg-shaped and ellipse-shaped examples detailed above. In general, it is desirable to have a capture pad shape that does not require a large amount of extra material to be added. As a typical die package will have a plurality of vias (and therefore capture pads) disposed thereon, it is also desirable that the shape of the capture pads allow as many capture pads as possible to be disposed on the carrier surface, to allow greater bonding possibilities. The specific number and individual shape of capture pads can be according to a designer's requirements.

As well as freeing up the bonding area of the die package, the third, fourth and fifth embodiments which disclose asymmetrical capture pads and copper columns that follow the shapes of the capture pads have the added advantage of reducing stress in the Extra Low K (ELK) layers. Due to the copper columns being shaped to be asymmetrical, the copper column-capture pad bonds will be more stable than the bonds between the copper columns and the capture pads of the conventional art. In the examples shown in FIGS. 3C, 4A and 4B, the kidney or C-shaped copper column 230 has less potential for movement about a central point than the conventional copper columns 81, so there is less potential for ELK layer cracks to occur than in the conventional methods. Therefore, the proposed structure not only improves the electrical connectivity of the die package but also improves its mechanical stability.

By keeping the copper column as close as possible to the via without actually overhanging the via, maximum contact can be ensured, while minimizing the amount of material that needs to be used for the capture pad. If the capture pad is kept below a certain diameter, then more space on the carrier is available for bonding.

As will be appreciated by one skilled in the art, the shape of the copper column and corresponding shape of the capture pad are not limited to those examples provided in the disclosure. Any shaped copper column that follows an alternative (non-conventional) shape of a capture pad for bonding purposes, wherein the via is not filled with conductive material and the copper column is disposed on one side of the capture pad, falls within the scope of the invention. Furthermore, the proposal is not limited to a single copper column on a capture pad; the shape and number of the copper columns that can be placed on a single capture pad are only limited by the particular shape and diameter of that capture pad, as well as design requirements. It is also possible that individual copper columns on a single capture pad can have different shapes from each other.

In summary, the disclosure details a flip chip package, wherein copper columns are used to contact capture pads, which in turn are coupled to vias in the carrier that are coupled to circuit traces within the carrier. The vias are unfilled, and the capture pads may be asymmetrical about a centre of a respective via. The copper columns are placed totally on the capture pad such that no part is over the unfilled via opening. The number of copper columns that can be placed on an individual capture pad is not limited to one. In one embodiment, the copper column is shaped to follow the perimeter of the capture pad. This structure not only frees up the amount of bonding space available on a surface of the chip, but also results in greater stability due to less stress being placed on the ELK layers, thereby resulting in a structure with high electrical connectivity and mechanical stability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip chip package comprising:
   a carrier, comprising:
   at least a via, for coupling the surface of the carrier to electrical traces in the carrier, wherein the via is open and unfilled; and
   at least a capture pad electrically coupled to the via, wherein the capture pad is plated over the via; and
   a die, coupled to the carrier, comprising:
   at least a bond pad formed on the surface of the die; and
   at least a copper column, formed on the bond pad for coupling the die to the capture pad on the carrier, wherein the copper column is disposed on one side only of the capture pad, so the copper column is adjacent to but does not overlie the via opening.

2. The flip chip package of claim 1, wherein the capture pad is asymmetrical about at least one axis running through the centre of the via opening, and the copper column is disposed on the side of the capture pad having a greater surface area.

3. The flip chip package of claim 2, further comprising at least a solder bump formed at the end of the copper column for contacting the capture pad, wherein the solder bump and copper column are curved about the vertical plane such that they have at least one axis of asymmetry.

4. The flip chip package of claim 3, wherein the capture pad is egg shaped and a top view of the copper column is C-shaped.

5. The flip chip package of claim 2, wherein the capture pad comprises a rectangular section which is formed on one side about the via opening, and the copper column is disposed on the rectangular section.

6. The flip chip package of claim 1, wherein more than one copper column is formed entirely on the capture pad, each copper column comprises at least a solder bump formed at the end of the copper column for contacting the capture pad, and all copper columns and solder bumps are curved about the vertical plane such that each copper column and solder bump has at least one axis of asymmetry.

7. The flip chip package of claim 6, wherein each individual copper column has a different shape from each other.

* * * * *